(12) United States Patent
Trivedi et al.

(10) Patent No.: US 6,611,573 B2
(45) Date of Patent: Aug. 26, 2003

(54) NON-INTEGER DIVISION OF FREQUENCY

(75) Inventors: Pradeep R. Trivedi, Sunnyvale, CA (US); Tyler J. Thorp, Sunnyvale, CA (US); Dean Liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/930,051

(22) Filed: Aug. 14, 2001

(65) Prior Publication Data

US 2003/0034810 A1 Feb. 20, 2003

(51) Int. Cl.$^7$ ................................................ H03K 21/00
(52) U.S. Cl. ........................................ 377/48; 327/117
(58) Field of Search ................................ 327/115, 117; 377/47, 48

(56) References Cited

U.S. PATENT DOCUMENTS

| | | | | | |
|---|---|---|---|---|---|
| 4,012,745 A | * | 3/1977 | Brown et al. | ................. | 347/80 |
| 4,238,649 A | * | 12/1980 | Kemler | ........................ | 379/12 |
| 4,975,931 A | * | 12/1990 | Cosand | ........................ | 377/110 |
| 5,384,816 A | * | 1/1995 | Prysby et al. | ................. | 377/48 |

\* cited by examiner

*Primary Examiner*—Timothy P. Callahan
*Assistant Examiner*—Cassandra Cox
(74) *Attorney, Agent, or Firm*—Rosenthal & Osha L.L.P.

(57) ABSTRACT

A method and apparatus for dividing a signal's frequency by a non-integer value is provided. Further, a method and apparatus for dividing a signal's frequency by a non-integer value by counting phases of the signal is provided.

26 Claims, 3 Drawing Sheets

NON-INTEGER DIVISION OF FREQUENCY

BACKGROUND OF THE INVENTION

As the operating frequencies of modern computers continue to increase, power consumption by such computers increases accordingly. The relationship between power consumption and frequency is given in Equation 1.

$$P=CV^2f \qquad (1)$$

In Equation 1, P represents power, C represents capacitance, V represents voltage, and f represents frequency. It is evident from Equation 1 that as f increases, P increases proportionally.

However, sometimes, increased power consumption may not be desirable or feasible at all parts of a computer system due to one or more system constraints, testing purposes, or performance concerns. For example, when power consumption is increased, temperature accordingly increases, and this may lead to diminished reliability. Further, due to increased power consumption at certain parts of the computer system, the supply of power at other parts of the computer system may be adversely affected. Thus, in order to avoid such problems caused by increased power consumption, frequency at particular parts of the computer system is decreased, i.e., "divided down." FIGS. 1a and 1b show a typical prior art approach to dividing down a frequency of a signal.

Specifically, FIG. 1a shows a frequency divider (10) that is formed by a positive edge-triggered D-Q flip-flop (also referred to as "D-Q flip-flop") (12) and a delay stage (14), which is formed by an inverter (16). An input signal, CLK_IN, serves as an input to a clock input of the D-Q flip-flop (12). A Q output of the D-Q flip-flop (12), via FLIP_FLOP_OUT, serves as an input to the delay stage (14), which, in turn, outputs to both a D input of the D-Q flip-flop (12) and an output, CLK_OUT, of the frequency divider (10).

FIG. 1b shows a timing diagram (20) of the frequency divider (10) shown in FIG. 1a. If the D input to the D-Q flip-flop (12) is initially logic high, i.e., '1', when a first positive edge, i.e., a first "rising" edge, on CLK_IN (22) triggers the D-Q flip-flop (12), the D-Q flip-flop outputs logic high on FLIP_FLOP_OUT (24). The logic high on FLIP_FLOP_OUT (24) is inputted by the delay stage (14), which, in turn, inverts the logic high on FLIP_FLOP_OUT (24) and outputs logic low, i.e., '0', on CLK_OUT (26). The logic low outputted by the delay stage (14) also propagates to the D input of the D-Q flip-flop (12) to ready the D-Q flip-flop (12) for the next time it is triggered.

A next rising edge on CLK_IN (28) triggers the D-Q flip-flop (12) causing the D-Q flip-flop (12) to output logic low on FLIP_FLOP_OUT (30) due to the logic low at the D input of the D-Q flip-flop (12). The logic low on FLIP_FLOP_OUT (30) is inputted by the delay stage (14), which, in turn, inverts the logic low on FLIP_FLOP_OUT (30) and outputs logic high on CLK_OUT (32). The logic high outputted by the delay stage (14) also propagates to the D input of the D-Q flip-flop (12) to ready the D-Q flip-flop (12) for the next time it is triggered.

The description of the timing diagram (20) of FIG. 1b shows that the frequency of CLK_OUT is one-half that of CLK_IN. In other words, the frequency of CLK_OUT is equal to the frequency of CLK_IN divided by two. Essentially, the frequency divider (10) of FIG. 1a and other prior art frequency dividers generate an output signal by counting the number of cycle of an input signal. For example, the frequency divider (10) of FIG. 1a generates one cycle on an output signal for every two cycles on an input signal. Furthermore, the capability of most frequency dividers can be extended to allow the generation of multiple output signal frequencies, where the multiple output signal frequencies are generated by dividing down an input signal's frequency by particular integer values.

FIG. 2a shows a typical prior art frequency divider (40) that is capable of generating multiple output signal frequencies. Specifically, FIG. 2a shows a frequency divider (40) that is formed by four negative edge-triggered J-K flip-flops (also individually referred to as "J-K flip-flop") (42, 44, 46, 48). The J and K inputs to the four J-K flip-flops (42, 44, 46, 48) are tied to logic high, and thus, every time a negative edge, i.e., a "falling" edge, arrives at a clock input of one of the four J-K flip-flops (42, 44, 46, 48), the value stored inside that J-K flip-flop is inverted. The Q outputs of the first, second, and third J-K flip-flops (42, 44, 46) are connected to the clock inputs of the second, third, and fourth J-K flip-flops (44, 46, 48), respectively. Further, the signals from the Q outputs of the first, second, and third J-K flip-flops (42, 44, 46) are represented by $C_0$, $C_1$, and $C_2$, respectively. The clock input of the first J-K flip-flop (42) is connected to an input signal, CLK, and the signal from the Q output of the fourth J-K flip-flop (48) is represented by $C_3$.

FIG. 2b shows a timing diagram (50) of the frequency divider (40) shown in FIG. 2a. Initially, the four J-K flip-flops (42, 44, 46, 48) store a logic low. At a first falling edge of CLK (52), the clock input of the first J-K flip-flop (42) is pulsed and the value stored in the first J-K flip-flop (42) goes from logic low to logic high, which results in logic high to go from the Q output of the first J-K flip-flop (42) to the clock input of the second J-K flip-flop (44). Moreover, this logic high at the Q output of the first J-K flip-flop (42) causes $C_0$ to go high (54). Thus, the first falling edge (52) at the clock input of the first J-K flip-flop (42) causes $C_0$ to go high (54). However, the logic high on $C_0$ (54) does not affect the value stored in the second J-K flip-flop (44) because the second J-K flip-flop (44) can only be triggered by a falling edge at its clock input.

At a second falling edge of CLK (56), the clock input of the first J-K flip-flop (42) is pulsed and the value stored in the first J-K flip-flop (42) goes from logic high to logic low, which results in logic low to go from the Q output of the first J-K flip-flop (42) to the clock input of the second J-K flip-flop (44). Moreover, this logic low at the Q output of the first J-K flip-flop (42) causes $C_0$ to go low (58) and triggers the second J-K flip-flop (44). Thus, because $C_0$ goes high (54) at a first falling edge of CLK (52) and $C_0$ goes low (58) at a second falling edge of CLK (56), $C_O$'s frequency is one-half of CLK's frequency. In other words, the frequency divider (40) can generate a signal that has a frequency equal to that of a clock signal's frequency divided by two.

Because the second J-K flip-flop (44) is triggered by the falling edge on $C_0$ (58), the value stored in the second J-K flip-flop (44) goes from logic low to logic high, which results in logic high to go from the Q output of the second J-K flip-flop (44) to the clock input of the third J-K flip-flop (46). Moreover, this logic high at the Q output of the second J-K flip-flop (44) causes $C_1$ to go high (60). Thus, the second falling edge (56) at the clock input of the first J-K flip-flop (42) causes $C_0$ to go low (58), which, in turn, triggers the second J-K flip-flop (44) and causes $C_1$ to go high (60). However, the rising edge on $C_1$ (60) does not affect the value stored in the third J-K flip-flop (46) because the third J-K flip-flop (46) can only be triggered by a falling edge at its clock input.

At a fourth falling edge of CLK (62), the clock input of the first J-K flip-flop (42) is pulsed and the value stored in the first J-K flip-flop (42) goes from logic high to logic low, which results in logic low to go from the Q output of the first J-K flip-flop (42) to the clock input of the second J-K flip-flop (44). Moreover, this logic low at the Q output of the first J-K flip-flop (42) causes $C_0$ to go low (64) and triggers the second J-K flip-flop (44).

Because the second J-K flip-flop (44) is triggered by the falling edge on $C_0$ (64), the value stored in the second J-K flip-flop (44) goes from logic high to logic low, which results in logic low to go from the Q output of the second J-K flip-flop (44) to the clock input of the third J-K flip-flop (46). Moreover, this logic low at the Q output of the second J-K flip-flop (44) causes $C_1$ to go low (66). Thus, the fourth falling edge (62) at the clock input of the first J-K flip-flop (42) causes $C_0$ to go low (64), which, in turn, triggers the second J-K flip-flop (44) and causes $C_1$ to go low (66). Furthermore, because $C_1$ goes high (60) at a second falling edge of CLK (56) and $C_1$ goes low (66) at a fourth falling edge of CLK (62), $C_1$'s frequency is one-fourth of CLK's frequency. In other words, the frequency divider (40) can generate a signal that has a frequency equal to that of a clock signal's frequency divided by four.

Because $C_1$ goes low (66), the third J-K flip-flop (46) is triggered and the value stored in the third J-K flip-flop (46) goes from logic low to logic high, which results in logic high to go from the Q output of the third J-K flip-flop (46) to the clock input of the fourth J-K flip-flop (48). Moreover, this logic high at the Q output of the third J-K flip-flop (46) causes $C_2$ to go high (68). Thus, the fourth falling edge (62) at the clock input of the first J-K flip-flop (42) causes $C_0$ to go low (64), which, in turn, causes $C_1$ to go low (66), which, in turn, causes $C_2$ to go high (68). However, the rising edge on $C_2$ (68) does not affect the value stored in the third J-K flip-flop (46) because the third J-K flip-flop (46) can only be triggered by a falling edge at its clock input.

Those skilled in the art will understand that because the first J-K flip-flop (42) is pulsed at every falling edge of CLK and the second J-K flip-flop (44) is pulsed at every second falling edge of CLK, it follows that the third J-K flip-flop (46) is pulsed at every fourth falling edge of CLK and the fourth J-K flip-flop (48) is pulsed at every eighth falling edge of CLK. For instance, an eighth falling edge of CLK (70) causes $C_0$ to go low (72), which, in turn, causes $C_1$ to go low (74), which, in turn, causes $C_2$ to go low (76), which, in turn, causes $C_3$ to go high (78). Therefore, as shown in FIG. 2b, if CLK's frequency is represented by f, then the frequency of $C_0$ is f/2, the frequency of $C_1$ is f/4, the frequency of $C_2$ is f/8, and the frequency of $C_3$ is f/16.

Based on Equation 1 given above, frequency and power consumption are directly related, and thus, the dividing down of f by a particular integer value automatically results in the dividing down of P by that particular integer value. Similar to the frequency divider (10) shown in FIG. 1a, the frequency divider (40) shown in FIG. 2a essentially generates divided down signals by counting the number of cycles of an original signal.

However, although various situations require that power consumption be decreased, dividing down an original frequency by an integer value may result in performance degradation in cases where peak performance occurs at a frequency value that is not equal to the original frequency divided by any integer value.

SUMMARY OF THE INVENTION

In one aspect, a frequency divider that is capable of dividing down a frequency of a signal by a non-integer value comprises a phase counter stage that counts phases of the signal, where the phase counter stage generates a signal edge when a certain number of phases have been counted, and where an output signal of the frequency divider is generated dependent on the signal edge generated by the phase counter stage.

In another aspect, a method for dividing down a frequency of a signal by a non-integer value comprises counting phases of the signal, where a phase counter stage generates a signal edge when a certain number of phases have been counted, and generating an output signal dependent on the signal edge generated by the phase counter stage.

Other aspects and advantages of the invention will be apparent from the following description and the appended claims.

BRIEF DESCRIPTION OF DRAWINGS

FIG. 1b shows a timing diagram for the frequency divider shown in FIG. 1a.

FIG. 2b shows a timing diagram for the frequency divider shown in FIG. 2a.

FIG. 3b shows a timing diagram in accordance with the embodiment shown in FIG. 3a.

DETAILED DESCRIPTION

The present invention relates to a method and apparatus for a frequency divider that is capable of non-integer frequency division. More particularly, the present invention relates to a method and apparatus for a frequency divider that performs non-integer frequency division by counting phases of an input signal.

Figure 1A:
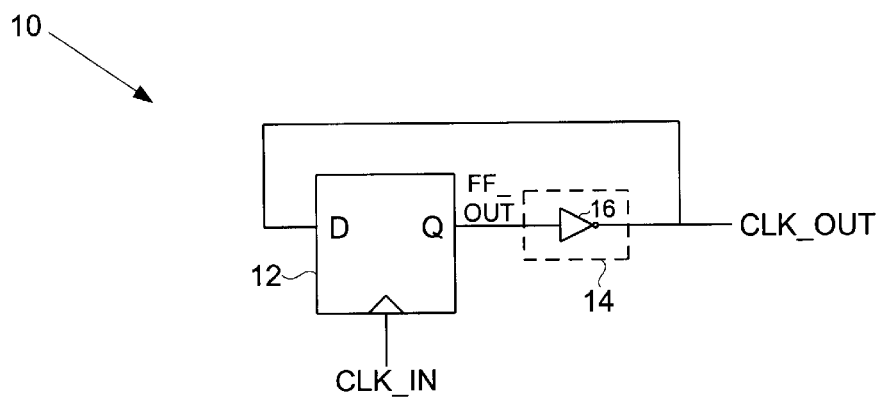
FIG. 1a shows a typical prior art frequency divider.
Figure 1B:
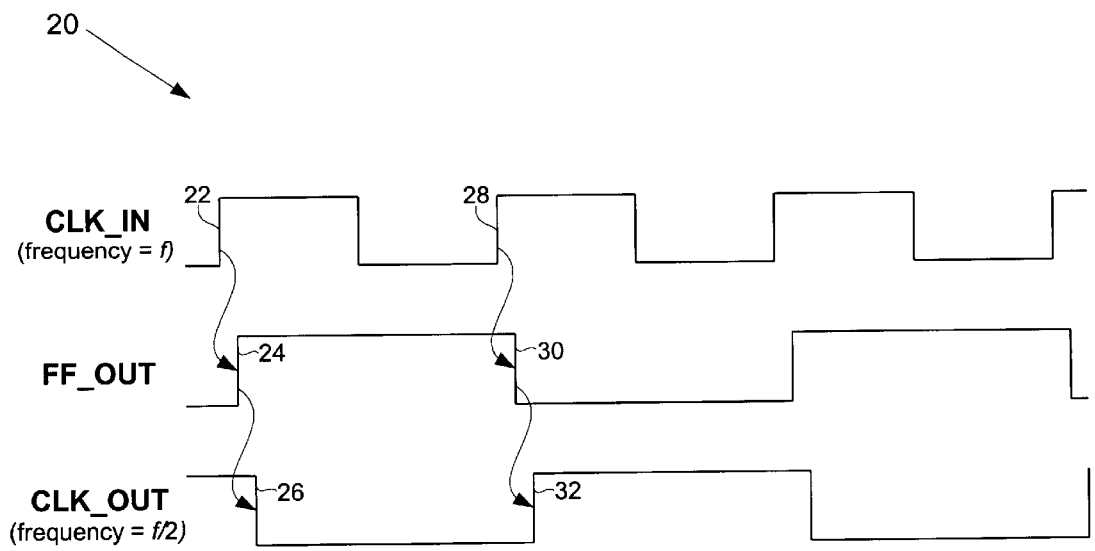
Figure 2A:
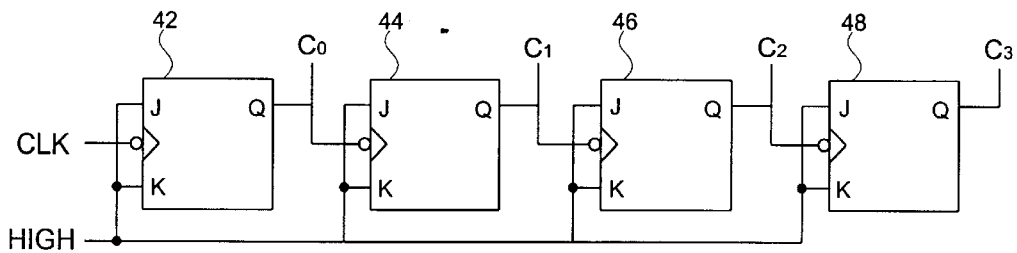
FIG. 2a shows a typical prior art frequency divider.
Figure 2B:
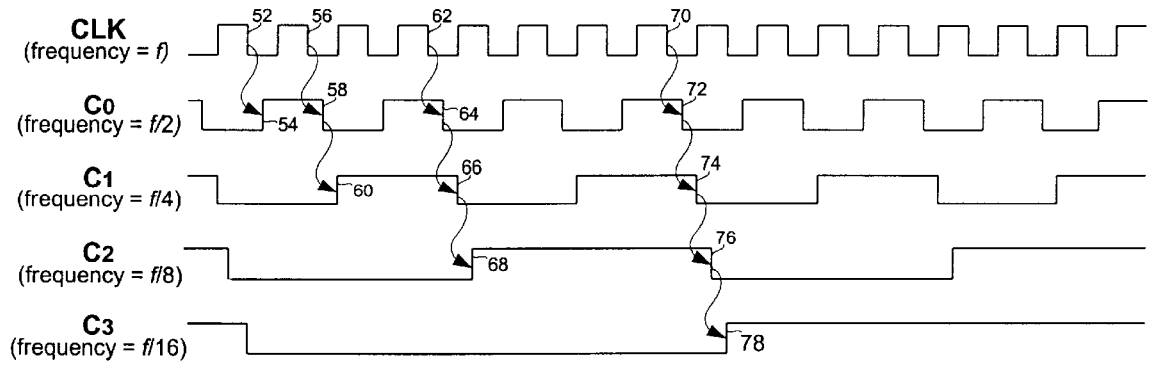
Figure 3A:
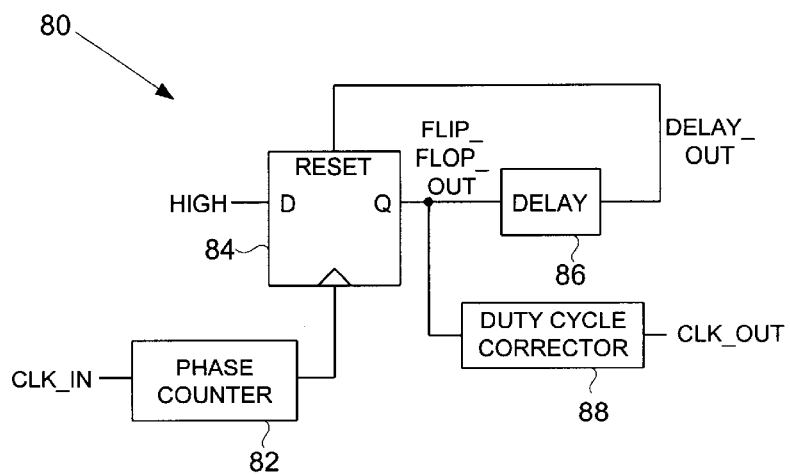
FIG. 3a shows a frequency divider in accordance with an embodiment of the present invention.

FIG. 3a shows a frequency divider (80) in accordance with an exemplary embodiment of the present invention. The frequency divider (80) includes a phase counter stage (82), a flip-flop stage (84), a delay stage (86), and a duty cycle corrector stage (88). An input signal, CLK_IN, serves as an input to the phase counter stage (82). The phase counter stage (82) outputs to a clock input of the flip-flop stage (84). The flip-flop stage (84), which has a data input connected to logic high, i.e., '1', outputs to both the delay stage (86) and the duty cycle corrector stage (88). The delay stage (86) outputs to a reset input of the flip-flop stage (84), and the duty cycle corrector stage (88) outputs an output signal, CLK_OUT, of the frequency divider (80).

For purposes of the description below with reference to FIG. 3b, the signal generated by the phase counter stage (82) is represented as PHASE_COUNT_OUT, the signal generated by the flip-flop stage (84) is represented as FLIP_FLOP_OUT, and the signal generated by the delay stage (86) is represented as DELAY_OUT Those skilled in the art will appreciate that the flip-flop stage (84) may be formed using a D-Q flip-flop, a J-K flip-flop, or another type of edge-triggered flip-flop. Further, those skilled in the art will appreciate that in other embodiments, the data input of the flip-flop stage (84) may be connected to logic low, i.e., '0'.

Figure 3B:
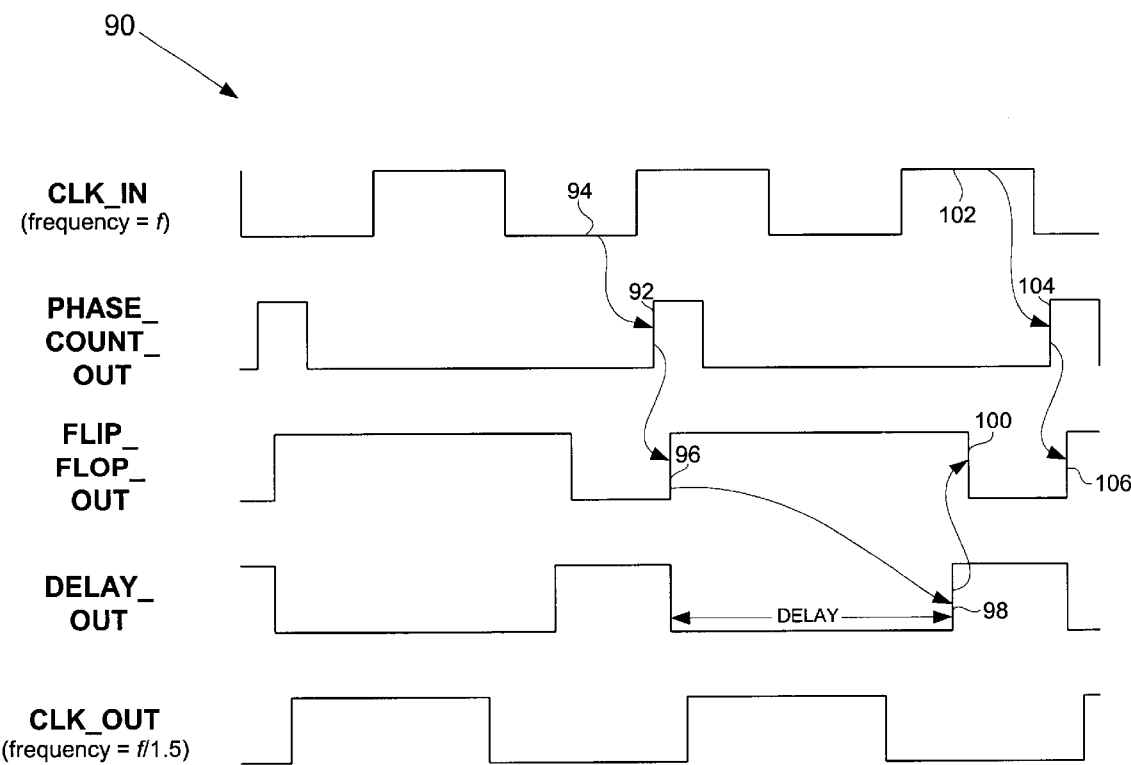

FIG. 3b shows an exemplary timing diagram (90) in accordance with the embodiment shown in FIG. 3a. Particularly, FIG. 3b shows timing waveforms for CLK_IN, PHASE_COUNT_OUT, FLIP_FLOP_OUT, DELAY_

OUT, and CLK_OUT when the frequency divider (80) generates a signal on CLK_OUT that has a frequency equal to that of the frequency of CLK_IN divided by 1.5.

CLK_IN is shown in FIG. 3b as a pulsing clock signal having a frequency of f. In order to divide down CLK_IN by 1.5, the phase counter stage (82) counts the phases of CLK_IN and outputs a rising edge on PHASE_COUNT_OUT (92) at a third phase of CLK_IN (94). The rising edge on PHASE_COUNT_OUT (92) triggers the flip-flop stage (84), which, in turn, outputs logic high on FLIP_FLOP_OUT (96) due to its data input being tied to logic high.

The logic high on FLIP_FLOP_OUT (96) is fed into the delay stage (86), which, after some delay (shown in FIG. 3b), outputs logic high on DELAY_OUT (98), where the logic high on DELAY_OUT (98) resets the flip-flop stage (84) causing the flip-flop stage (84) to output logic low on FLIP_FLOP_OUT (100).

At a next third phase of CLK_IN (102), the phase counter stage (82) outputs another rising edge on PHASE_COUNT_OUT (104), where the rising edge on PHASE_COUNT_OUT (104) causes the flip-flop stage (84) to output high on FLIP_FLOP_OUT (106), where after the process described above (96, 98, 100) is repeated. During the process described above with reference to FIG. 3b, the duty cycle corrector stage (88) continuously corrects the duty cycle of FLIP_FLOP_OUT according to system requirements and outputs CLK_OUT. Moreover, those skilled in the art will understand that CLK_OUT can be directly or indirectly dependent on the generation of a signal edge by the phase counter stage (82).

Those skilled in the art will appreciate that the process described above repeats itself for every third phase of CLK_IN. This leads to the frequency of CLK_OUT being equal to f/1.5, where f is the frequency of CLK_IN.

Moreover, those skilled in the art will appreciate that in other embodiments the frequency divider (80) may be used to divide down CLK_IN by other non-integer values, such as 2.5, in which case, the phase counter stage (82) would output a rising edge on PHASE_COUNT_OUT for every fifth phase of CLK_IN. Further, those skilled in the art will appreciate that the delay stage (86) may contain control logic or be programmable so that the delay amount can be automated based on the amount that CLK_IN is divided down by. In other embodiments, those skilled in the art will appreciate that the phase counter stage (82) may be programmable such that the amount that CLK_IN is divided down can be automatically selected without user intervention.

Further, those skilled in the art will appreciate that the duty cycle corrector stage (88) may not be necessary in certain embodiments depending on system requirements. Additionally, those skilled in the art will appreciate that in other embodiments, the present invention is capable of dividing down a signal by integer values as well as non-integer values.

Advantages of the present invention may include one or more of the following. In some embodiments, because a frequency divider counts phases of an input signal instead of cycles of the input signal, the frequency divider may generate an output signal that has a frequency equal to that of the input signal divided by a non-integer value.

In some embodiments, because a frequency divider can divide down an original signal's frequency by a non-integer value, performance may be improved in cases where higher performance occurs at frequency values that are non-integer factors of the original signal's frequency.

In some embodiments, because a frequency divider can divide down an original signal's frequency by a non-integer value, performance may be improved in cases where higher performance occurs at power consumption values that are related to frequency values that are non-integer dividends of the original signal's frequency.

In some embodiments, because a phase counter stage of a frequency divider is programmable, the frequency divider may be capable of dividing down a signal's frequency by various non-integer values.

In some embodiments, because a phase counter stage of a frequency divider is programmable, the frequency divider may be capable of dividing down a signal's frequency by integer values as well as by non-integer values.

In some embodiments, because a phase counter stage of a frequency divider is programmable, the amount that the frequency divider divides down an original signal's frequency may be automatically selected without user intervention.

In some embodiments, because a delay stage of a frequency divider is programmable, the amount of delay generated by the delay stage may be dependent on the amount that the frequency divider divides down an original signal.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A frequency divider that is capable of dividing down a frequency of a signal by a non-integer value, comprising:
   a phase counter stage that counts phases of the signal, wherein the phase counter stage generates a signal edge on an output from the phase counter stage when a certain number of phases have been counted; and
   a flip-flop stage having a clock input operatively connected to the output of the phase counter stage, wherein the signal edge generated by the phase counter stage triggers the flip-flop stage, and wherein the flip-flop stage selectively generates a first logic value at an output from the flip-flop stage when the phase counter stage triggers the flip-flop stage,
   wherein an output signal of the frequency divider is generated dependent on the first logic value.

2. The frequency divider of claim 1, wherein a frequency of the output signal of the frequency divider is equal to the frequency of the signal divided by the non-integer value.

3. The frequency divider of claim 1, wherein the certain number of phases is equal to twice the non-integer value.

4. The frequency divider of claim 1, wherein the phase counter stage is programmable.

5. The frequency divider of claim 1, wherein the flip-flop stage has a constant data input.

6. The frequency divider of claim 1, wherein the flip-flop stage comprises an edge-triggered flip-flop.

7. The frequency divider of claim 1, comprising:
   a delay stage to which the output from the flip-flop stage is connected; and
   a duty cycle corrector stage to which the output from the flip-flop stage is connected,
   wherein the duty cycle corrector stage generates the output signal of the frequency divider.

8. The frequency divider of claim 7, wherein the delay stage is programmable.

9. The frequency divider of claim 7, wherein the delay stage comprises control logic.

10. The frequency divider of claim 7, wherein the duty cycle corrector stage is programmable.

11. The frequency divider of claim 7, wherein the delay stage selectively generates a logic value that resets the flip-flop stage such that the flip-flop stage generates a second logic value at the output from the flip-flop stage.

12. The frequency divider of claim 11, wherein the second logic value generated by the flip-flop stage is complementary to the first logic value generated by the flip-flop stage.

13. The frequency divider of claim 11, wherein the duty cycle corrector stage corrects a duty cycle of the output from the flip-flop stage between a point when the flip-flop stage generated the first logic value and a point when the flip-flop stage generated the second logic value.

14. The frequency divider of claim 13, wherein the duty cycle corrector stage generates the output signal of the frequency divider based on the corrected duty cycle of the output from the flip-flop stage.

15. A method for dividing down a frequency of a signal by a non-integer value, comprising:

counting phases of the signal, wherein a phase counter stage generates a signal edge when a certain number of phases have been counted;

triggering a flip-flop stage having a clock input operatively connected to an output of the phase counter stage when the phase counter stage generates the signal edge;

selectively generating a first logic value at an output from the flip-flop stage when the flip-flop stage is triggered; and generating an output signal dependent on the first logic value.

16. The method of claim 15, wherein the phase counter stage is programmable.

17. The method of claim 15, wherein the flip-flop stage comprises an edge-triggered flip-flop.

18. The method of claim 15, wherein the flip-flop stage has a constant data in put.

19. The method of claim 15, wherein a delay stage is connected to the output from the flip-flop stage, the delay stage comprising:

selectively generating a logic value that resets the flip-flop stage such that the flip-flop stage generates a second logic value at the output from the flip-flop stage.

20. The method of claim 19, wherein the second logic value generated by the flip-flop stage is complementary to the first logic value generated by the flip-flop stage.

21. The method of claim 19, wherein the delay stage is programmable.

22. The method of claim 20, wherein the delay stage comprises control logic.

23. The method of claim 19, wherein a duty cycle corrector stage is connected to the output from the flip-flop stage, the duty cycle corrector stage comprising:

selectively correcting a duty cycle of the output from the flip-flop stage between a point when the flip-flop stage generated the first logic value and a point when the flip-flop generated the second logic value; and generating the output signal based on the corrected duty cycle of the output from the flip-flop stage.

24. A frequency divider that is capable of dividing down a frequency of a signal by a non-integer value, comprising:

phase counting means for generating a signal edge when a certain number of phases on the signal have been counted; and flip-flop means for selectively generating a flip-flop means output signal dependent on the signal edge generated by the phase counter means, wherein a clock input of the flip-flop means is operatively connected to the phase counting means, wherein an output signal of the frequency divider is dependent on the flip-flop means output signal.

25. The frequency divider of claim 24, further comprising:

delay means for delaying the flip-flop means output signal, wherein after a delay, the delay means resets the flip-flop means.

26. The frequency divider of claim 24, further comprising:

duty cycle correction means for correcting a duty cycle of the flip-flop means output signal.

* * * * *